United States Patent
Lee et al.

(10) Patent No.: US 9,755,027 B2
(45) Date of Patent: Sep. 5, 2017

(54) ELECTRONICAL DEVICE

(71) Applicant: ELECTRONICS AND TELECOMMUNICATIONS RESEARCH INSTITUTE, Daejeon (KR)

(72) Inventors: Hyung Seok Lee, Daejeon (KR); Ki Hwan Kim, Seoul (KR); Sang Choon Ko, Daejeon (KR); Zin-Sig Kim, Daejeon (KR); Jeho Na, Seoul (KR); Eun Soo Nam, Daejeon (KR); Young Rak Park, Daejeon (KR); Junbo Park, Seoul (KR); Chi hoon Jun, Daejeon (KR); Dong Yun Jung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/265,647

(22) Filed: Sep. 14, 2016

(65) Prior Publication Data
US 2017/0077282 A1 Mar. 16, 2017

(30) Foreign Application Priority Data

Sep. 15, 2015 (KR) .................. 10-2015-0130445
Jan. 22, 2016 (KR) .................. 10-2016-0008222

(51) Int. Cl.
| | | |
|---|---|---|
| H01L 29/66 | (2006.01) |
| H01L 29/40 | (2006.01) |
| H01L 29/778 | (2006.01) |
| H01L 29/423 | (2006.01) |
| H01L 29/20 | (2006.01) |
| H01L 29/417 | (2006.01) |

(52) U.S. Cl.
CPC ...... H01L 29/402 (2013.01); H01L 29/66462 (2013.01); H01L 29/7786 (2013.01); *H01L 29/2003* (2013.01); *H01L 29/41766* (2013.01); *H01L 29/4236* (2013.01); *H01L 29/42376* (2013.01)

(58) Field of Classification Search
CPC . H01L 29/205; H01L 29/402; H01L 29/4236; H01L 29/42376
USPC .................... 257/12, 97, 192, 196
See application file for complete search history.

(56) References Cited

U.S. PATENT DOCUMENTS 6,864,510 B2    3/2005   Youn et al.
8,608,315 B2    12/2013  Friese et al.
(Continued)

FOREIGN PATENT DOCUMENTS

KR    10-0782430 B1    12/2007
KR    10-1057439 B1    8/2011
KR    10-2012-0012304 A    2/2012

*Primary Examiner* — Tan N Tran
(74) *Attorney, Agent, or Firm* — Rabin & Berdo, P.C.

(57) ABSTRACT

Provided is an electronic device. The electronic device includes a first semiconductor layer and a second semiconductor layer sequentially stacked on a substrate and a source electrode, a gate electrode, and a drain electrode arranged on the second semiconductor layer. The electronic device further includes a field plate which is electrically connected to the source electrode and extends towards the drain electrode, wherein the field plate becomes farther away from the substrate as the field plate becomes closer to the drain electrode.

8 Claims, 15 Drawing Sheets

(56) References Cited

U.S. PATENT DOCUMENTS

| | | | |
|---|---|---|---|
| 8,716,141 B2 | 5/2014 | Dora et al. | |
| 9,276,569 B2* | 3/2016 | Ikeda | H01L 25/072 |
| 2005/0253168 A1 | 11/2005 | Wu et al. | |
| 2008/0073670 A1 | 3/2008 | Yang et al. | |
| 2009/0173968 A1* | 7/2009 | Matsunaga | H01L 29/7787 |
| | | | 257/192 |
| 2015/0144961 A1 | 5/2015 | Yoon et al. | |

* cited by examiner

ELECTRONICAL DEVICE

CROSS-REFERENCE TO RELATED APPLICATIONS

This U.S. non-provisional patent application claims the benefit of priority under 35 U.S.C. §119 of Korean Patent Application Nos. 10-2015-0130445, filed on Sep. 15, 2015, and 10-2016-0008222, filed on Jan. 22, 2016, the entire contents of which are hereby incorporated by reference.

BACKGROUND

The disclosed embodiments relate to an electronic device, and more particularly, to an electronic device including a transistor.

Recently, a hetero-junction field effect transistor (HFET) is manufactured using a nitride-based compound semiconductor to meet the requirements of a high-frequency and high-power electronic device. In general, compared to typical semiconductor materials such as Si or GaAs, nitride semiconductors have a wide energy band gap, high thermal and chemical stability, and a high electron saturation velocity, and are thus widely used in high-frequency and high-power electronic devices.

In particular, gallium nitride semiconductors, which have a high electric field intensity ($3.0 \times 10^6$ V/cm) and a high electron mobility (1500 $cm^2$/Vs at 300K) compared to silicon semiconductors, are receiving attention as next-generation materials for power semiconductors. In particular, reliability and a breakdown voltage are important factors for nitride field effect transistors as power semiconductors. In order to increase the breakdown voltage of a power semiconductor, a high electric field peak on an edge portion of a gate electrode should be minimized.

SUMMARY

Embodiments may provide an electronic device including a transistor with an improved breakdown voltage.

The purposes of the present disclosure are not limited to the above-mentioned purposes, and other purposes not mentioned would be clearly understood by those skilled in the art from the disclosure below.

Some embodiments of the inventive concept provides an electronic device including: a substrate; a first semiconductor layer disposed on the substrate and including a group III-V semiconductor compound; a second semiconductor layer covering at least a part of the first semiconductor layer and including the group III-V semiconductor compound; a source electrode and a drain electrode disposed on the first semiconductor layer and spaced apart horizontally from each other; a gate electrode disposed on the second semiconductor layer and between the source electrode and the drain electrode; and a field plate contacting the source electrode and extending towards the drain electrode, wherein as the field plate becomes closer to the drain electrode, the field plate becomes farther away from the substrate.

In an embodiment, the field plate may include a first horizontal part contacting the source electrode, a second horizontal part spaced apart from the first horizontal part vertically and horizontally, and a connection part connecting the first and second horizontal parts.

In an embodiment, the connection part may include a third horizontal part disposed between the first and second horizontal parts, a first vertical part connecting the first and third horizontal parts, and a second vertical part connecting the second and third horizontal parts.

In an embodiment, the connection part may have an angle ranging from about 20° to about 90°.

In an embodiment, a distance between an end portion of the gate electrode adjacent to the drain electrode and an end portion of the first horizontal part of the field plate adjacent to the drain electrode may be in a range of from about 0.5 µm to about 5 µm.

In an embodiment, the electronic device may further include a gate insulating layer between the gate electrode and the second semiconductor layer.

In an embodiment, the gate electrode may have a rectangular or trapezoidal cross section.

In an embodiment, the gate electrode may include a lower part inserted into the second semiconductor layer and an upper part connected to the lower part and disposed on the second semiconductor layer, the gate electrode having a T-shaped cross section.

In an embodiment, the field plate may cover the gate electrode but may not cover the drain electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
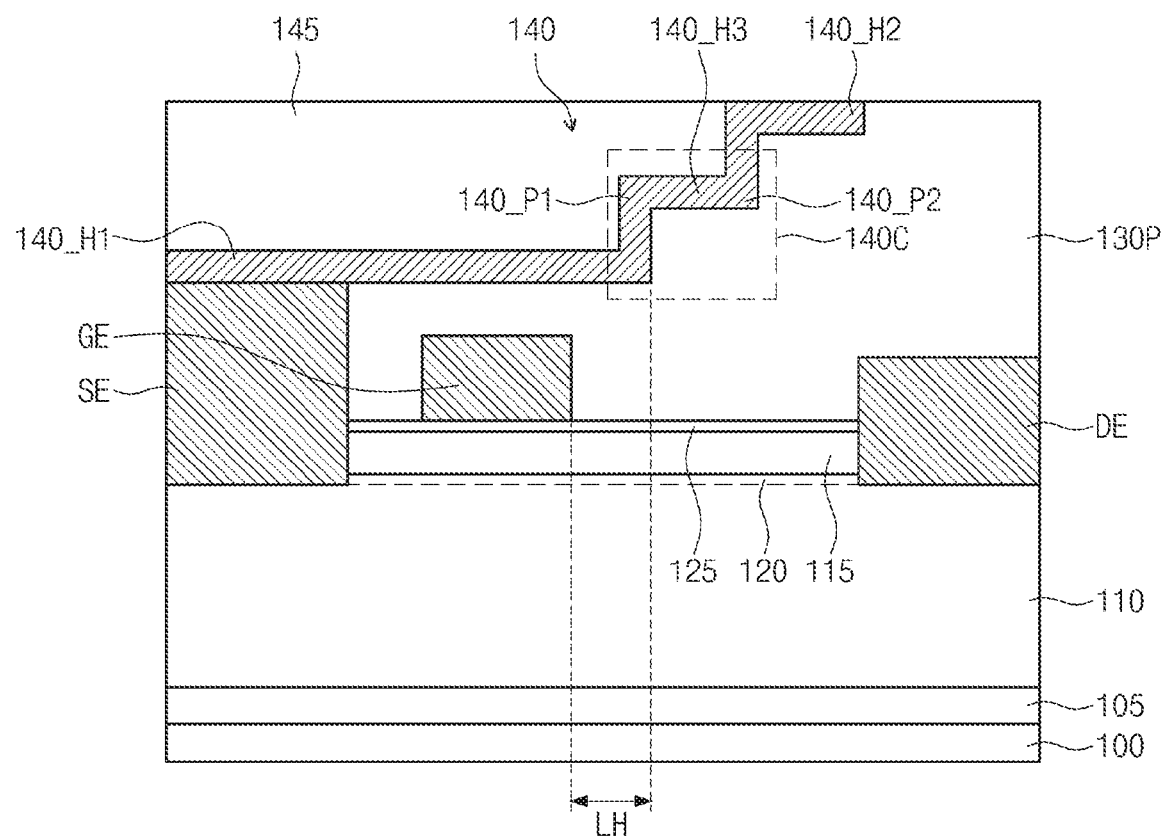
FIGS. 1A to 1C are cross-sectional views illustrating electronic devices according to some exemplary embodiments.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that when an element is referred to as being "on" another element, it can be directly on the other element, or a third element may be present therebetween. In the drawings, the dimensions of elements are exaggerated for clarity of illustration.

The embodiments of the inventive concept will be described with reference to exemplary cross-sectional view and/or planar views. In the drawings, the dimensions of layers and regions are exaggerated for clarity of illustration. Therefore, the forms of the exemplary drawings may be changed due to a manufacturing technology and/or error tolerance. Therefore, the embodiments of the inventive concept may involve changes of shapes depending on a manufacturing process, without being limited to the illustrated specific forms. For example, an etching region illustrated as being angulated may have a rounded shape or a certain curvature. Therefore, the regions illustrated in the drawings are merely schematic, and the shapes of the regions exemplify specific shapes of the elements but do not limit the scope of the invention. Relational terms such as "first", "second", and the like are used in various embodiments of the inventive concept to describe various elements, but the elements should not be limited by the terms. Such terms are merely used to distinguish one element from another element. The embodiments described herein include complementary embodiments thereof.

The terminology used herein is not for delimiting the embodiments of the inventive concept but for describing the embodiments. The terms of a singular form may include plural forms unless otherwise specified. The term "include", "including", "comprise" and/or "comprising" used herein does not preclude the presence or addition of one or more other elements.

Hereinafter, embodiments of the inventive concept will be described in detail with reference to the accompanying drawings.

Figure 1B:
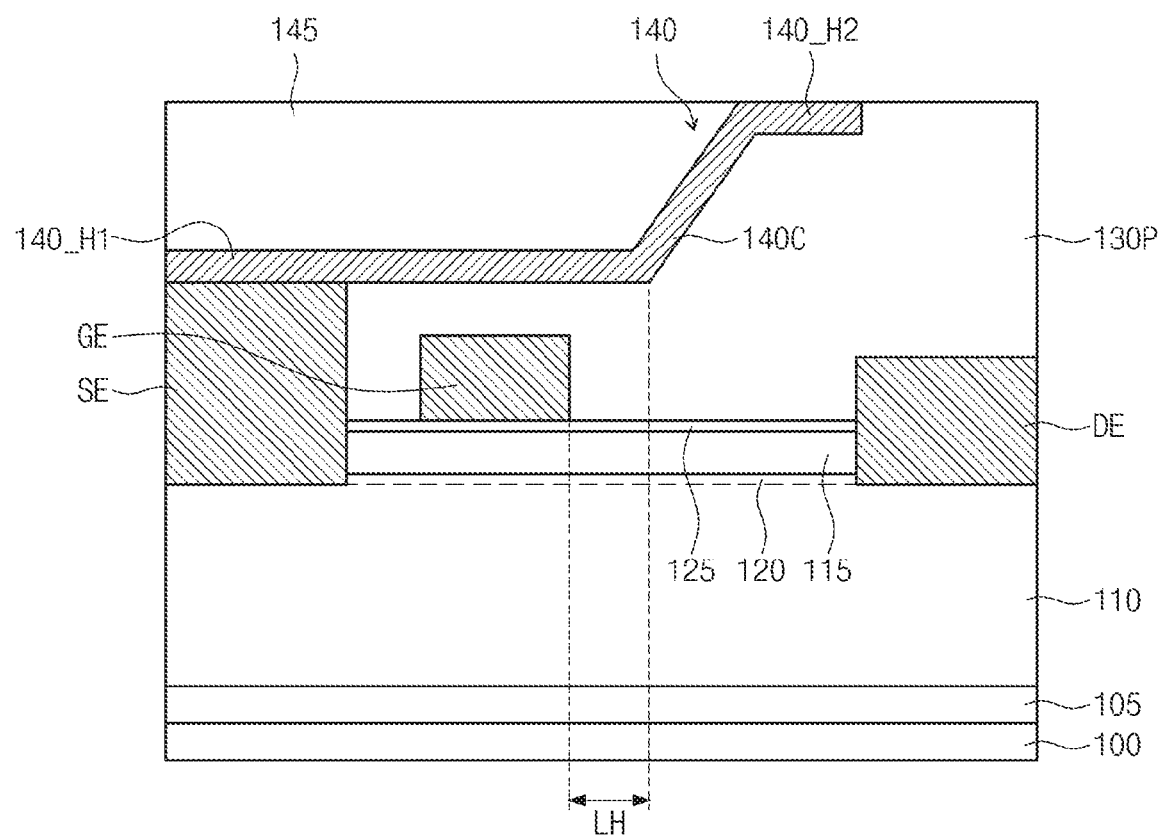
Figure 1C:
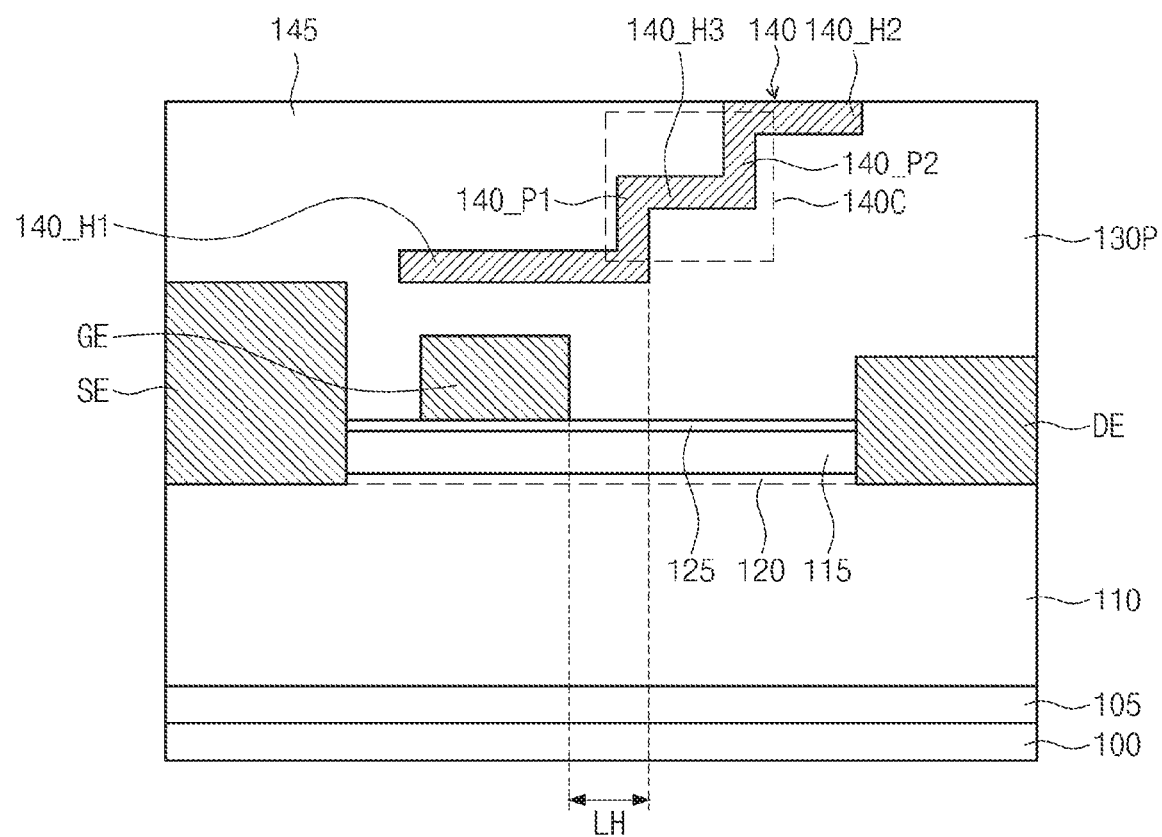

FIGS. 1A to 1C are cross-sectional views illustrating electronic devices according to some exemplary embodiments. Each electronic device described below may include a transistor.

Referring to FIGS. 1A to 1C, each electronic device may include a substrate 100, a gate electrode GE, a source electrode SE, and a drain electrode DE.

The substrate 100 may include at least one of silicon, sapphire, SiC, or GaN. A nucleation layer 105, a first semiconductor layer 110, and a second semiconductor layer 115 may be further provide on the substrate 100. The nucleation layer 105 may be provided to generate a crystal nucleus when growing the first semiconductor layer 110. The nucleation layer 105 may include a nitride semiconductor layer such as MN. In the case that the substrate 100 includes GaN, the nucleation layer 105 may not be provided.

The first semiconductor layer 110 may include a group III-V semiconductor compound, for example, at least one of GaN, GaAs, or InN. The second semiconductor layer 115 may include at least one of AlGaN, AlGaAs, or AlInN The first semiconductor layer 110 and the second semiconductor layer 115 may be compound semiconductor layers having different lattice constants, and a 2-dimensional electron gas (2-DEG) region 120 may be generated by a hetero-junction structure in an interface between the first semiconductor layer 110 and the second semiconductor layer 115. The 2-DEG region 120 may be used as a channel of a transistor.

The gate electrode GE, the source electrode SE, and the drain electrode DE may include a conductive material. For example, the foregoing electrodes may include a metal, a conductive metal oxide, or a conductive metal nitride. The foregoing electrodes may include at least one of Ti, Al, Ni, Pd, Au, W, Ir, Cu, or an oxide or nitride thereof. The foregoing materials may be provided as a multilayer. For example, the gate electrode GE may include TiN or TaN, and the source electrode SE and the drain electrode DE may have a structure in which a TiN layer and an Al layer are sequentially stacked.

According to some embodiments of the inventive concept, in the case that the electronic device includes a metal insulator silicon (MIS) transistor, a gate insulating layer 125 may be further provided between the gate electrode GE and the second semiconductor layer 115. The gate insulating layer 125 may include a silicon oxide or a metal oxide. The metal oxide may include a high-dielectric-constant material such as $HfO_2$ or $Al_3O_2$. According to other embodiments of the inventive concept, in the case that the electronic device includes a high electron mobility transistor (HEMT), the gate insulating layer 125 may not be provided between the gate electrode GE and the second semiconductor layer 115.

An insulating pattern 130P, which covers the source electrode SE, the gate electrode GE, and the drain electrode DE, may be further provided. The insulating pattern 130P may expose at least a part of the source electrode SE, and may have a thickness which increases in a direction from the source electrode SE to the drain electrode DE. For example, the insulating pattern 130P may have a stepped upper surface.

According to some embodiments of the inventive concept, a field plate 140, which is electrically connected to the source electrode SE and extends towards the drain electrode DE, may be further included. The field plate 140 may be disposed on the insulating pattern 130P. The electronic device may further include an upper insulating pattern 145 covering the field plate 140. As illustrated in FIGS. 1A and 1B, the field plate 140 may directly contact the source electrode SE so as to be electrically connected thereto. As illustrated in FIG. 1C, the field plate 140 may be electrically connected to the source electrode SE indirectly via other conductive patterns (not shown).

Referring to FIGS. 1A to 1C, the field plate 140 may have a stepped structure which becomes farther away from a surface of the substrate 100 while extending in a direction from the source electrode SE to the drain electrode DE. The field plate 140 may cover the gate electrode GE, but may not cover the drain electrode DE.

The field plate 140 may include a first horizontal part 140_H1 connected to the source electrode SE and a second horizontal part 140_H2 spaced apart from the first horizontal part 140_H1. The first horizontal part 140_H1 and the second horizontal part 140_H2 may be spaced apart from each other vertically and horizontally. A distance LH between an end portion of the gate electrode GE adjacent to the drain electrode DE and an end portion of the first horizontal part 140_H1 adjacent to the drain electrode DE may be in a range of from about 0.5 μm to about 5 μm. Furthermore, a connection part 140C, which connects the first horizontal part 140_H1 to the second horizontal part 140_H2, may be provided. An angle that the connection part 140C forms may be in a range of from about 20° to about 90°.

For example, referring to FIGS. 1A and 1C, a third horizontal part 140_H3 may be further disposed between the first horizontal part 140_H1 and the second horizontal part 140_H2, and a first vertical part 140_P1 which connects the first horizontal part 140_H1 to the third horizontal part 140_H3 and a second vertical part 140_P2 which connects the third horizontal part 140_H3 to the second horizontal part 140_H2 may be further provided. That is, the first vertical part 140_P1, the third horizontal part 140_H3, and the second vertical part 140_P2 may serve as the connection part 140C.

For another example, referring to FIG. 1B, the connection part 140C may directly connect the first horizontal part 140_H1 to the second horizontal part 140_H2. However, a structure for connecting the first horizontal part 140_H1 to the second horizontal part 140_H2 is not limited thereto.

The field plate 140 may include substantially the same material as the source electrode SE. For example, the field plate 140 may include at least one of Ti, Al, Pd, Au, W, or an oxide or nitride thereof.

According to some embodiments of the inventive concept, when a voltage is applied between the source electrode SE and the drain electrode DE, a high electric field peak generated at an edge of the gate electrode GE adjacent to the drain electrode DE may be reduced by virtue of the field plate 140 connected to the source electrode SE. Accordingly, a breakdown voltage of the transistor may be increased.

The gate electrode GE may have various structures. The structure of the gate electrode GE is described below.

FIGS. 2A to 2D are cross-sectional views illustrating a structure of a gate electrode according to some exemplary embodiments.

Figure 2A:
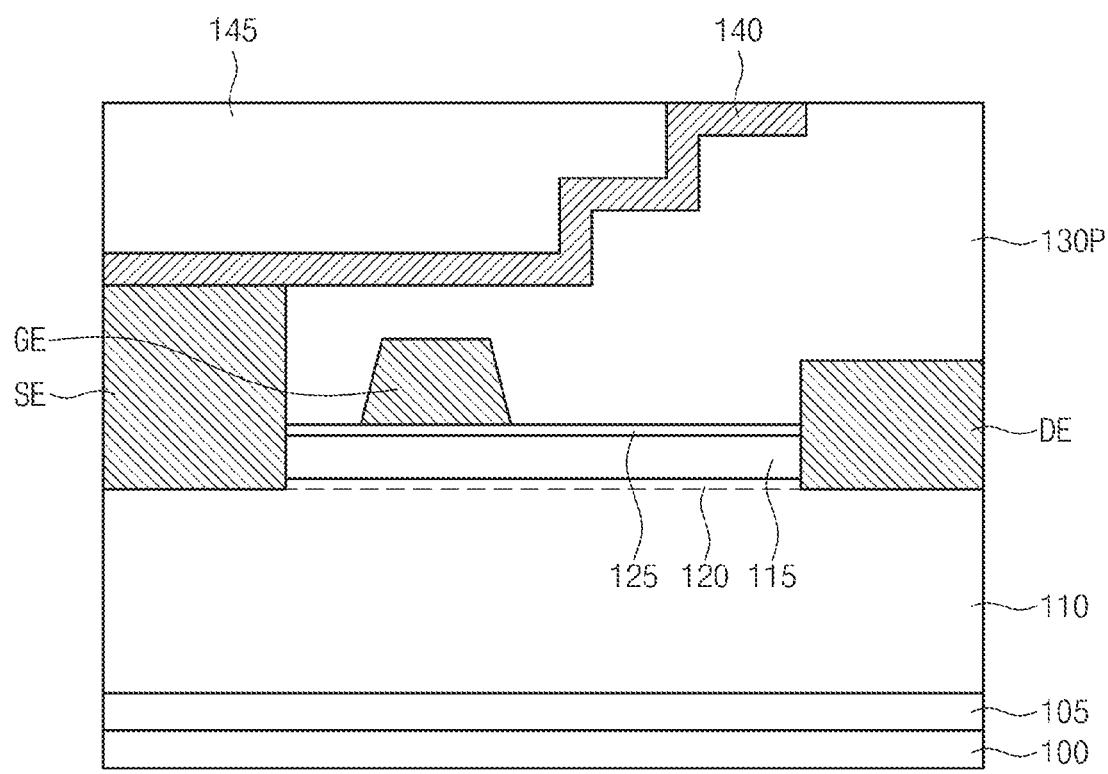
FIGS. 2A to 2D are cross-sectional views illustrating a structure of a gate electrode according to some exemplary embodiments.

Referring to FIG. 1A, the gate electrode GE may be disposed on the second semiconductor layer 115, and may have a rectangular cross section. Referring to FIG. 2A, the gate electrode GE may be disposed on the second semiconductor layer 115, and may have a trapezoidal cross section.

Figure 2B:
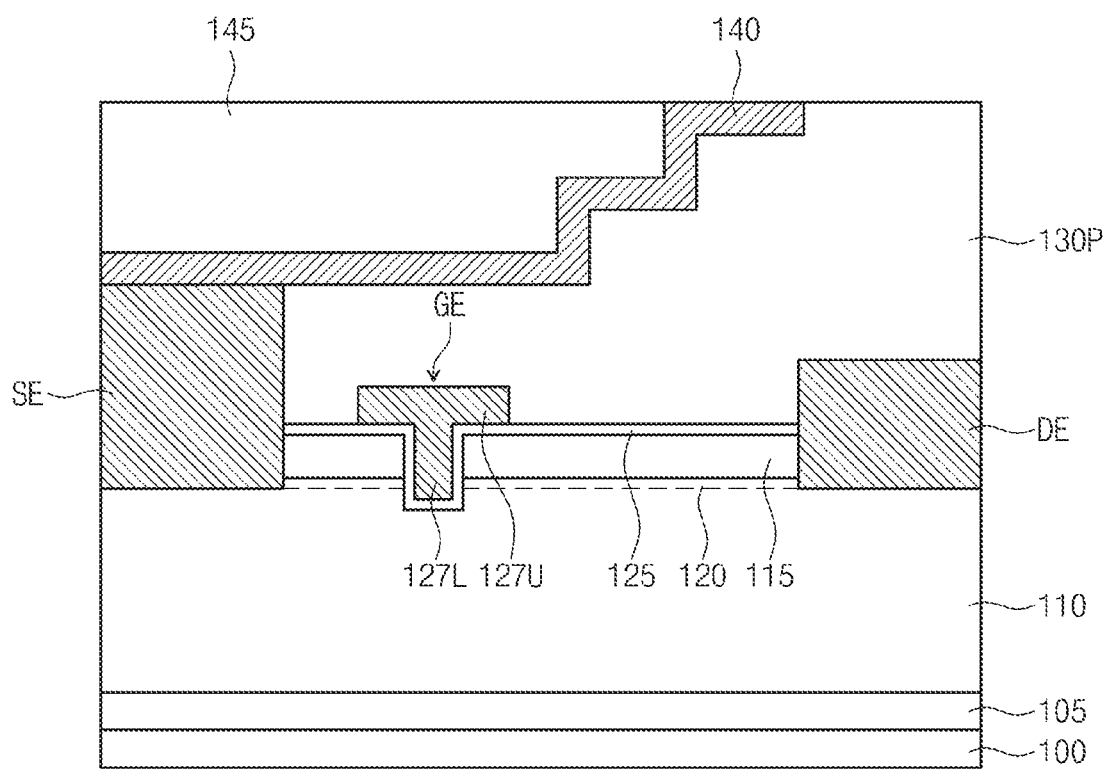
Figure 2C:
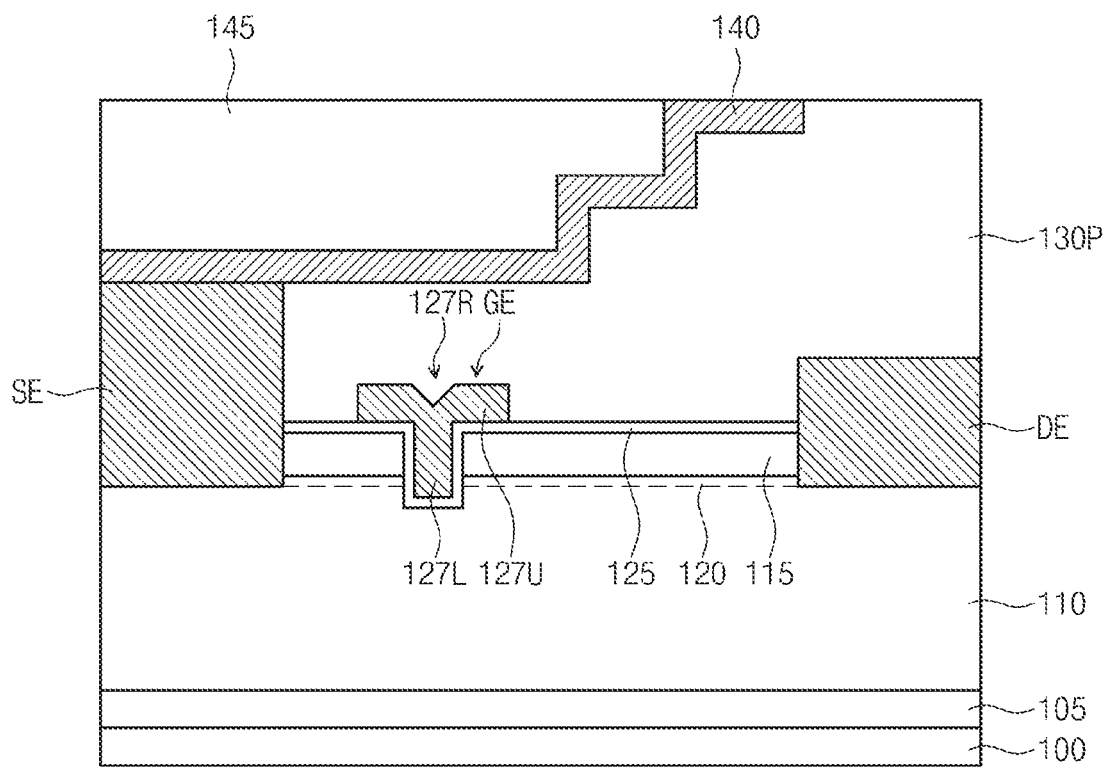
Figure 2D:
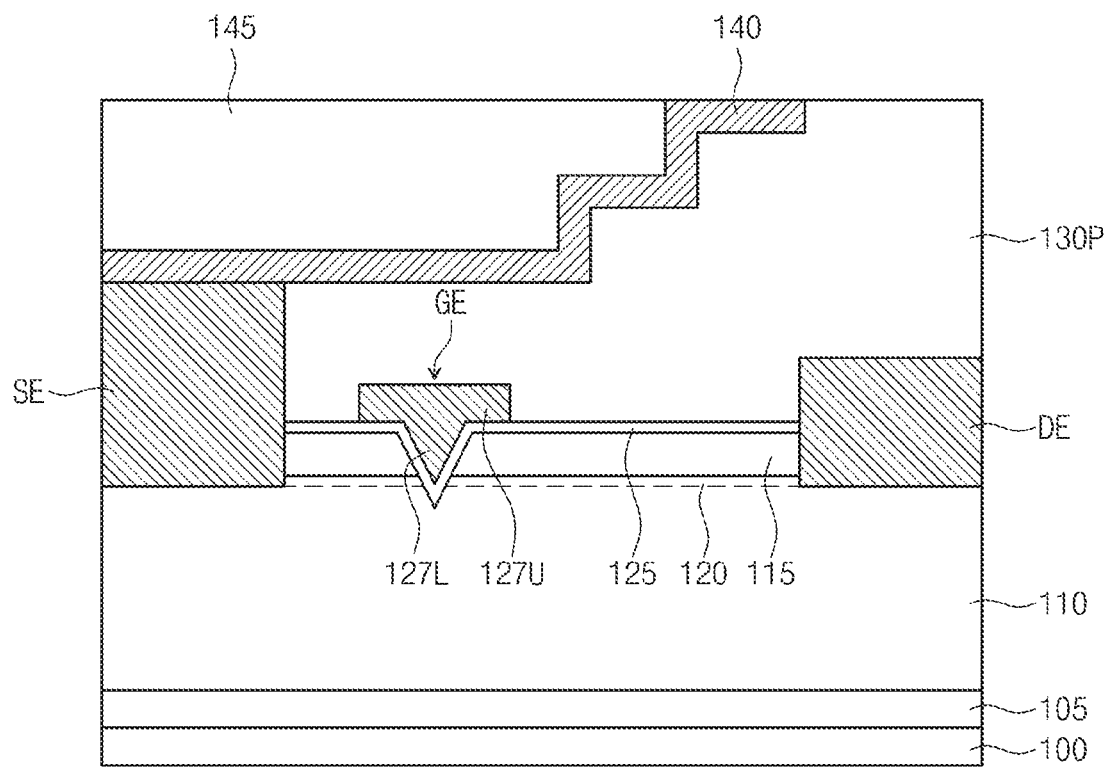

Referring to FIGS. 2B to 2D, the gate electrode GE may include a lower part 127L which passes through the interior of the second semiconductor layer 115 and an upper part 127U disposed on the second semiconductor layer 115. Referring to FIG. 2B, the upper part 127U of the gate electrode GE may have a rectangular cross section. Referring to FIG. 2C, the upper part 127U of the gate electrode GE may have a cross section which is generally shaped like a rectangle and is provided with a recessed part 127R at a center portion. Referring to FIG. 2D, the upper part 127U of the gate electrode GE may have a rectangular cross section, and the lower part 127L of the gate electrode GE may have a triangular cross section.

Hereinafter, a method for manufacturing a transistor of the inventive concept will be described with reference to the accompanying drawings. FIGS. 3A to 3H are cross-sectional views illustrating a method for manufacturing a transistor of some exemplary embodiments.

Figure 3A:
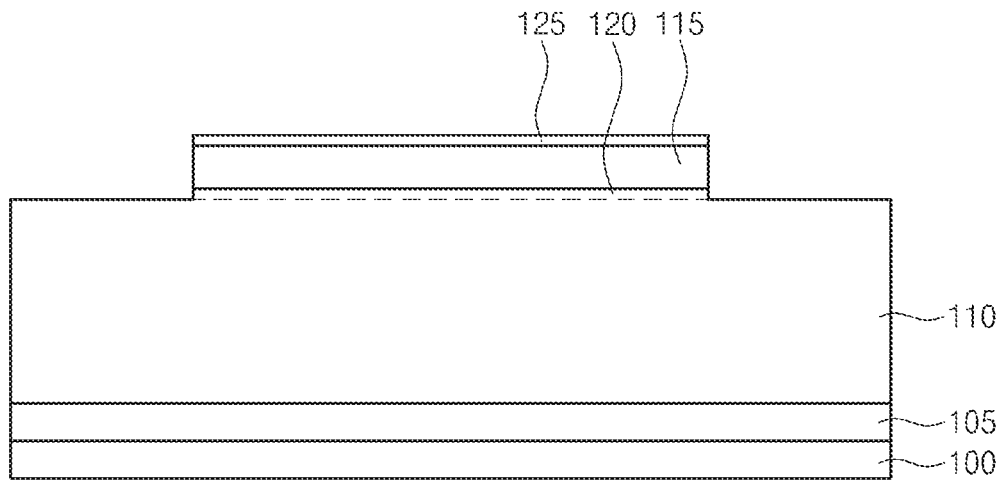
FIGS. 3A to 3H are cross-sectional views illustrating a method for manufacturing a transistor of some exemplary embodiments.

Referring to FIG. 3A, the nucleation layer 105, the first semiconductor layer 110, and the second semiconductor layer 115 may be sequentially formed on the substrate 100.

According to some embodiments of the inventive concept, the substrate 100 may include at least one of sapphire, SiC, or GaN. The nucleation layer 105 may be formed on the substrate 100. The nucleation layer 105 may include a nitride semiconductor layer such as MN. In the case that the substrate 100 includes GaN selectively, the nucleation layer 105 may not be formed. The second semiconductor layer 115 may be formed after growing the first semiconductor layer 110 from the nucleation layer 105. The first semiconductor layer 110 may include at least one of GaN, GaAs, or InN, and the second semiconductor layer 115 may include at least one of AlGaN, AlGaAs, or AlInN The first semiconductor layer 110 and the second semiconductor layer 115 may be compound semiconductor layers having different lattice constants, and the 2-DEG region 120 may be generated by a hetero-junction structure in the interface between the first semiconductor layer 110 and the second semiconductor layer 115. The 2-DEG region 120 may be used as a channel of a transistor.

Optionally, the gate insulating layer 125 may be further formed on the semiconductor layer 115. The gate insulating layer 125 may not be provided according to the type of the electronic device.

The gate insulating layer 125 and the second semiconductor layer 115 may be removed by patterning the gate insulating layer 125 and the second semiconductor layer 115, so that the first semiconductor layer 110 may be exposed.

Figure 3B:
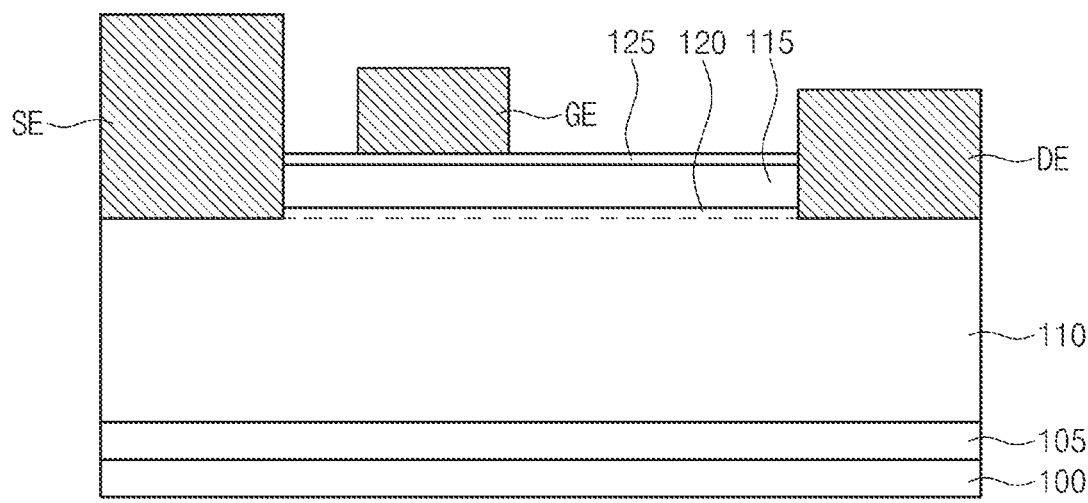

Referring to FIG. 3B, the source electrode SE and the drain electrode DE may be respectively formed at both end portions of each of the patterned gate insulating layer 125 and second semiconductor layer 115. For example, the source electrode SE and the drain electrode DE may be formed together by patterning a conductive film (not shown) after forming the conductive film on the exposed first semiconductor layer 110 and both end portions of each of the patterned gate insulating layer 125 and second semiconductor layer 115. For another example, the source electrode SE may be formed by patterning a first conductive film (not shown) after forming the first conductive film on the patterned second semiconductor layer 115, the 2-DEG region 120, and the first semiconductor layer 110, and the drain electrode DE may be formed by patterning a second conductive film (not shown) after forming the second conductive film.

Thereafter, the gate electrode GE may be formed on the second semiconductor layer 115. The gate electrode GE may be formed together with the source electrode SE and the drain electrode DE, or may be separately formed.

Figure 3C:
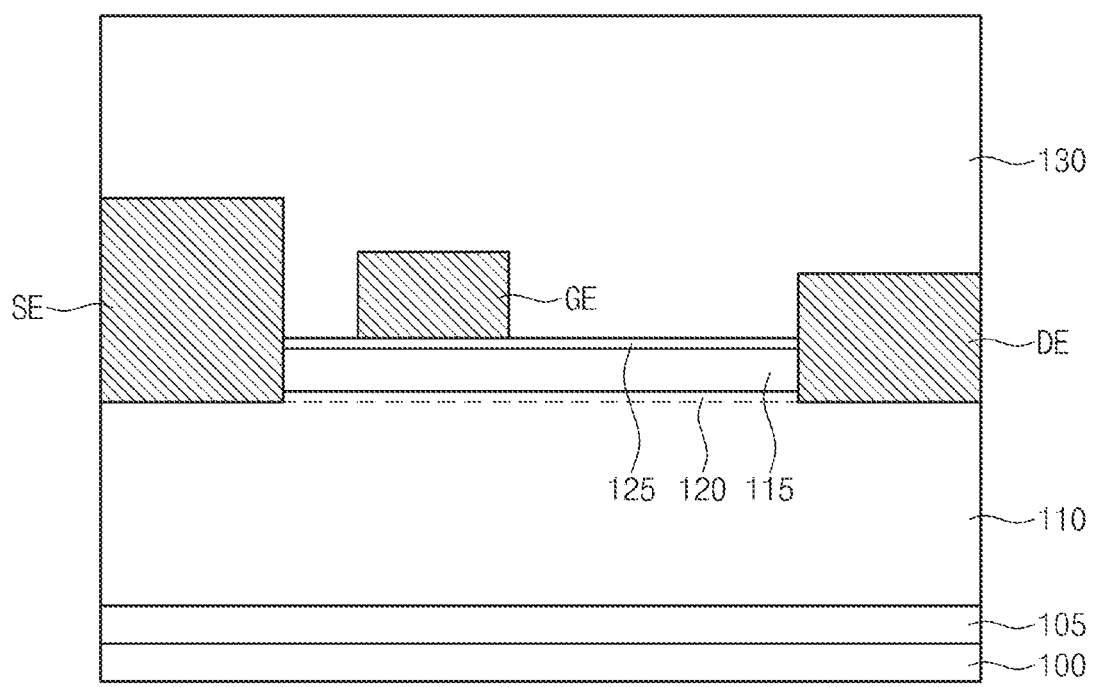

Referring to FIG. 3C, an insulating layer 130 may be formed covering the source electrode SE, the drain electrode DE, and the gate electrode GE. The insulating layer 130 may include a silicon nitride.

Referring to FIGS. 3D to 3G, the insulating pattern 130P, which exposes an upper surface of the source electrode SE and covers the gate electrode GE and the drain electrode DE, may be formed by patterning the insulating layer 130.

Figure 3D:
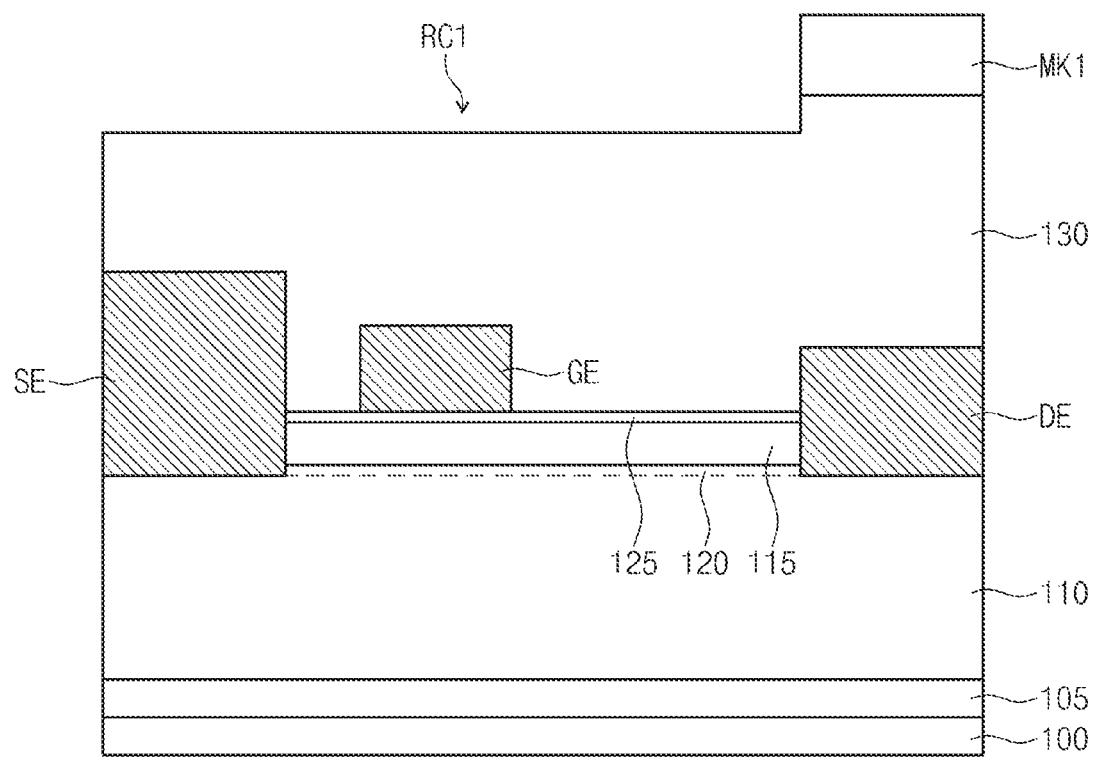

According to some embodiments of the inventive concept, as illustrated in FIG. 3D, a first mask pattern MK1, which covers the drain electrode DE and exposes the gate electrode GE, may be formed on the insulating layer 130, and then a first recess RC1 may be formed by etching the insulating layer 130 using the first mask pattern MK1 as an etching mask. The first mask pattern MK1 may be removed.

Figure 3E:
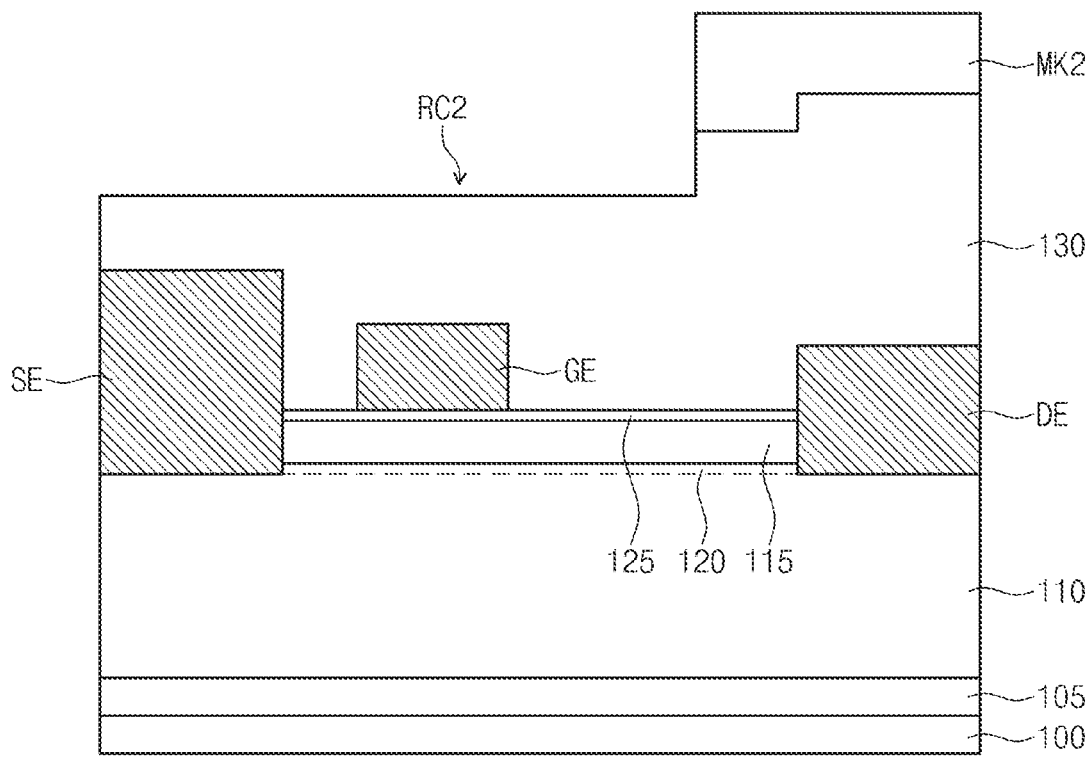

Referring to FIG. 3E, a second mask pattern MK2, which covers a part of the first recess RC1, may be formed on the insulating layer 130, and then a second recess RC2 may be formed by etching the insulating layer 130 using the second mask pattern MK2 as an etching mask. The second mask pattern MK2 may be removed.

Figure 3F:
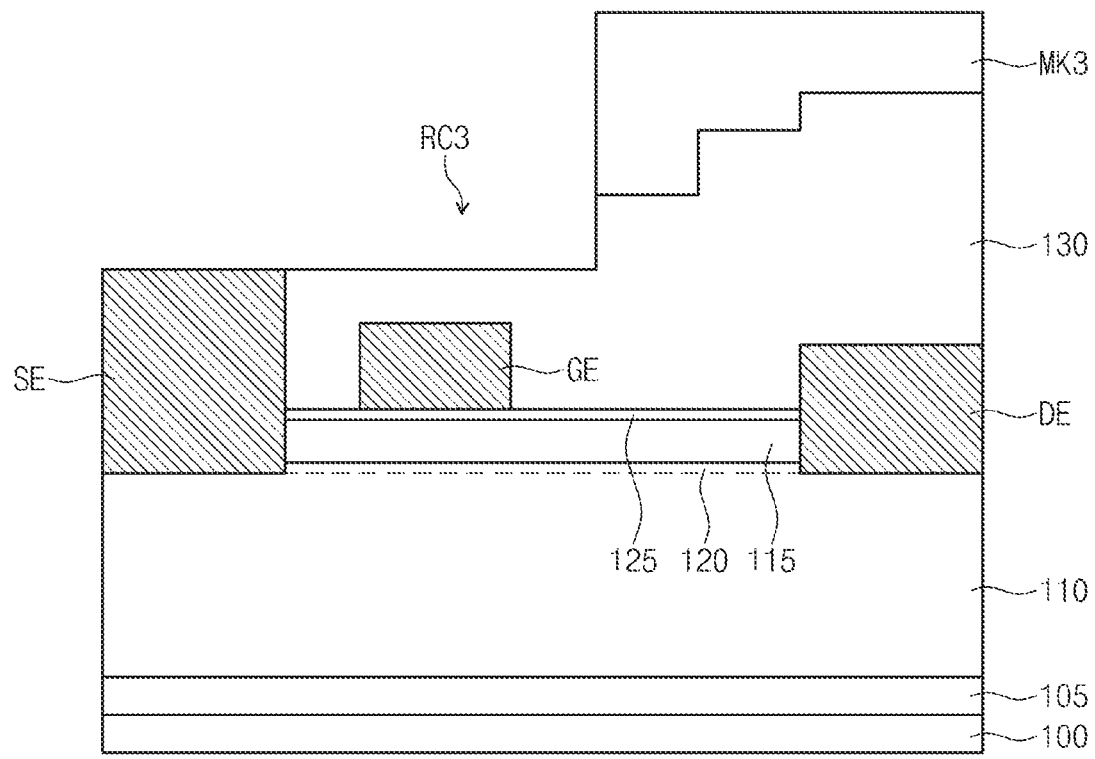

Referring to FIG. 3F, a third mask pattern MK3, which covers a part of the second recess RC2, may be formed on the insulating layer 130, and then a third recess RC3 may be formed by etching the insulating layer 130 using the third mask pattern MK3 as an etching mask. The third recess RC3 may expose at least a part of the source electrode SE.

Figure 3G:
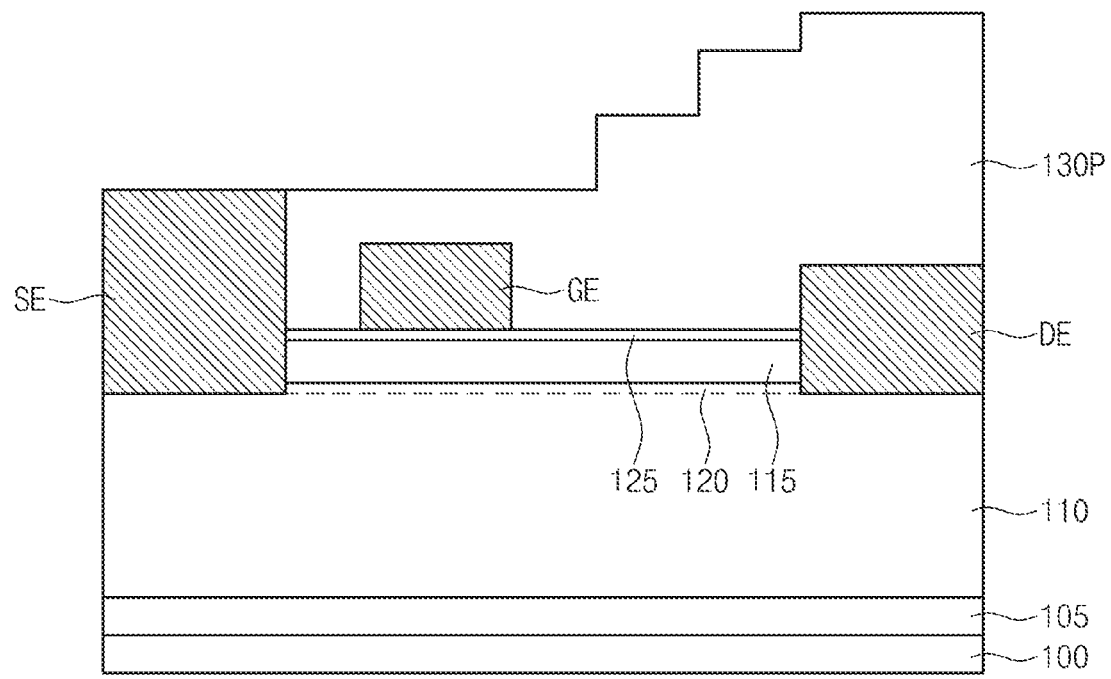

Referring to FIG. 3G, the third mask pattern MK3 may be removed. As illustrated in FIGS. 3D to 3G, the insulating pattern 130P having a stepped structure which becomes thicker in a direction from the source electrode SE to the drain electrode DE may be formed.

Figure 3H:
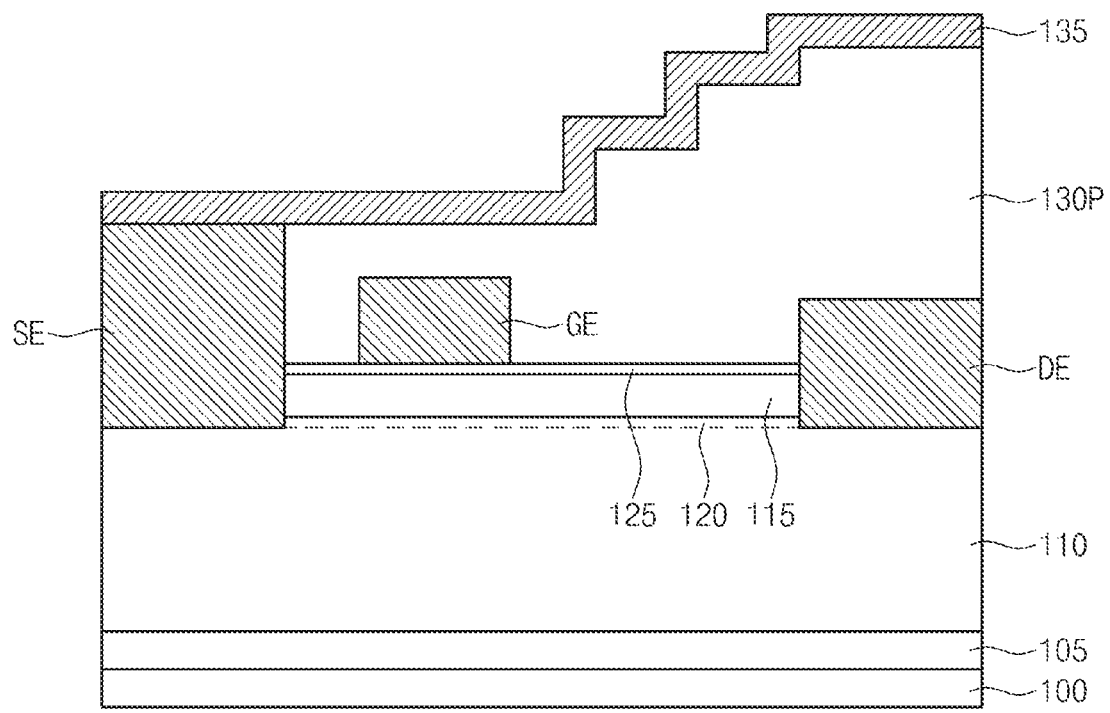

Referring to FIG. 3H, a third conductive layer 135 may be formed on the insulating pattern 130P. The third conductive layer 135 may include substantially the same material as the source electrode SE.

Referring back to FIG. 1A, by patterning the third conductive layer 135, the field plate 140 may be formed on the insulating pattern 130P contacting the source electrode SE and corresponding to the stepped structure. The field plate 140 may have a structure corresponding to the insulating pattern 130P.

Figure 4:
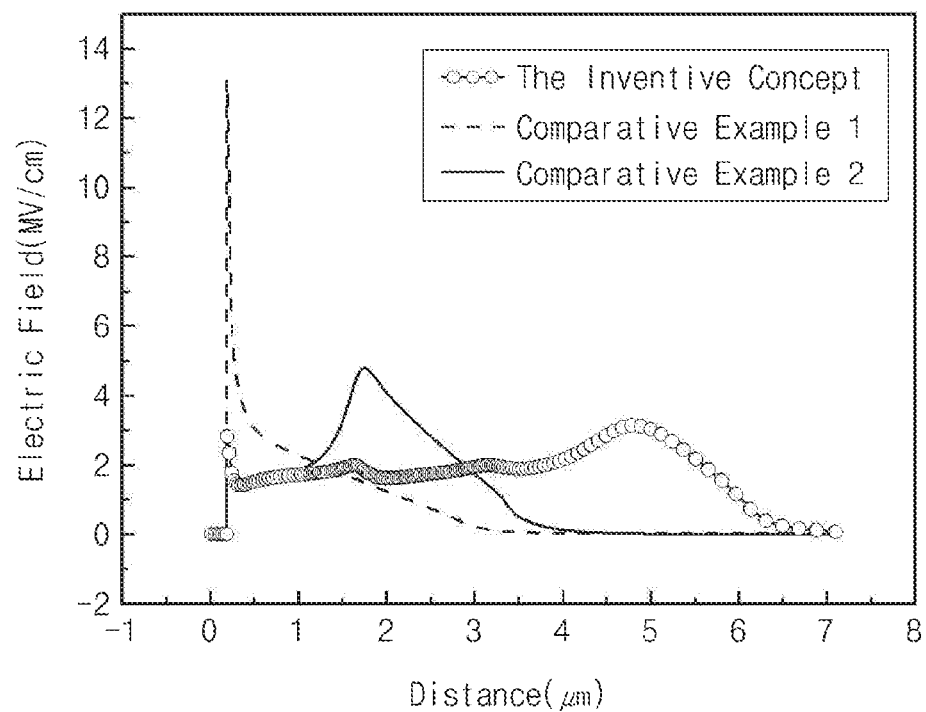
FIG. 4 is a graph for comparing electric fields between a typical electronic device and an electronic device according to some exemplary embodiments.

FIG. 4 is a graph for comparing electric fields between Comparative Example 1, Comparative Example 2 and an electronic device according to an embodiment of the inventive concept. Here, Comparative Example 1 is the electronic device without a field plate, and Comparative Example 2 is the electronic device with a typical field plate. The x-axis represents a distance from an edge portion of a gate electrode towards a drain electrode.

The electronic device according to an embodiment of the inventive concept includes a field plate which is electrically connected to a source electrode and becomes farther from a substrate in a direction from the source electrode to the drain electrode. However, Comparative Example 2 includes a field plate which is electrically connected to a source electrode but is parallel with a surface of a substrate. Referring to FIG. 4, it may be understood that the electric field strength in the electronic device according to an embodiment of the inventive concept is lower than that of Comparative Example 1 and 2 at an adjacent portion to the edge portion of the gate electrode.

In particular, the electric field strength increases to about 13 MV/cm or higher at the edge of the gate electrode of Comparative Example 1, so that the second semiconductor layer under the gate electrode or the gate insulating layer may be damaged. Accordingly, the breakdown voltage of the electronic device decreases, which degrades the reliability. On the contrary, the electric field strength is about 4 MV/cm or lower at the edge of the gate electrode of the electronic device according to an embodiment of the inventive concept, so that the second semiconductor layer under the gate electrode or the gate insulating layer may not be damaged. Therefore, the breakdown voltage of the electronic device may increase.

Furthermore, the critical electric field strength of Comparative Example 2 (5 MV/cm) is higher than that of GaN (3.4 MV/cm). On the contrary, the electric field strength of the electronic device according to an embodiment of the inventive concept is lower than that of GaN (3.4 MV/cm), so that the second semiconductor layer under the gate electrode or the gate insulating layer may not be damaged. Therefore, the breakdown voltage of the electronic device may increase.

As described above, the electric field peak is reduced at the edge portion of the gate electrode, and thus the breakdown voltage of the electronic device is improved, thereby improving the reliability of the electronic device.

According to embodiments of the inventive concept, the electric field peak may be reduced and the breakdown voltage of an electronic device may be improved by applying a field plate which is electrically connected to a source electrode and has a stepped structure. Therefore, the reliability of the electronic device may be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An electronic device comprising:
a substrate;
a first semiconductor layer disposed on the substrate and comprising a group III-V semiconductor compound;
a second semiconductor layer covering at least a part of the first semiconductor layer and comprising the group III-V semiconductor compound;
a source electrode and a drain electrode disposed on the first semiconductor layer and spaced apart horizontally from each other;
a gate electrode disposed on the second semiconductor layer and between the source electrode and the drain electrode; and
a field plate contacting the source electrode and extending towards the drain electrode, wherein as the field plate becomes closer to the drain electrode, the field plate becomes farther away from the substrate,
wherein the field plate comprises a first horizontal part contacting the source electrode, a second horizontal part spaced apart from the first horizontal part vertically and horizontally, and a connection part connecting the first and second horizontal parts, and
wherein the connection part comprises a third horizontal part disposed between the first and second horizontal parts, a first vertical part connecting the first and third horizontal parts, and a second vertical part connecting the second and third horizontal parts.

2. The electronic device of claim 1, wherein the connection part has an angle ranging from about 20° to about 90°.

3. The electronic device of claim 1, wherein a distance between an end portion of the gate electrode adjacent to the drain electrode and an end portion of the first horizontal part of the field plate adjacent to the drain electrode is in a range of from about 0.5µm to about 5 µm.

4. The electronic device of claim 1, further comprising a gate insulating layer between the gate electrode and the second semiconductor layer.

5. The electronic device of claim 1, wherein the gate electrode has a rectangular or trapezoidal cross section.

6. The electronic device of claim 1, wherein the gate electrode comprises a lower part inserted into the second semiconductor layer and an upper part connected to the lower part and disposed on the second semiconductor layer, the gate electrode having a T-shaped cross section.

7. The electronic device of claim 1, wherein the field plate covers the gate electrode but does not cover the drain electrode.

8. An electronic device comprising:
a substrate;
a first semiconductor layer disposed on the substrate and comprising a group III-V semiconductor compound;
a second semiconductor layer covering at least a part of the first semiconductor layer and comprising the group III-V semiconductor compound;
a source electrode and a drain electrode disposed on the first semiconductor layer and spaced apart horizontally from each other;
a gate electrode disposed on the second semiconductor layer and between the source electrode and the drain electrode; and
a field plate contacting the source electrode and extending towards the drain electrode, wherein as the field plate becomes closer to the drain electrode, the field plate becomes farther away from the substrate,
wherein the field plate comprises a first horizontal part contacting the source electrode, a second horizontal part spaced apart from the first horizontal part vertically and horizontally, and a connection part connecting the first and second horizontal parts, and
wherein the first horizontal part horizontally extends from a first end connected to the source electrode, to a second end opposite to the first end, and the connection part is connected to and in direct contact with the second end of the first horizontal part.

* * * * *